(12) United States Patent
Takeshima et al.

(10) Patent No.: US 11,372,070 B2
(45) Date of Patent: Jun. 28, 2022

(54) DATA PROCESSING APPARATUS AND METHOD

(71) Applicant: Canon Medical Systems Corporation, Otawara (JP)

(72) Inventors: Hidenori Takeshima, Kawasaki (JP); Masao Yui, Otawara (JP); Yuichi Yamashita, Tokyo (JP)

(73) Assignee: Canon Medical Systems Corporation, Otawara (JP)

(*) Notice: Subject to any disclaimer, the term of this patent is extended or adjusted under 35 U.S.C. 154(b) by 312 days.

(21) Appl. No.: 16/798,574

(22) Filed: Feb. 24, 2020

(65) Prior Publication Data

US 2020/0271743 A1 Aug. 27, 2020

(30) Foreign Application Priority Data

Feb. 26, 2019 (JP) .............................. JP2019-032901

(51) Int. Cl.
*G01R 33/561* (2006.01)
*G01R 33/48* (2006.01)
*G06N 20/00* (2019.01)
*G06N 5/04* (2006.01)
*G06N 3/08* (2006.01)

(52) U.S. Cl.
CPC ....... *G01R 33/5618* (2013.01); *G01R 33/482* (2013.01); *G06N 3/084* (2013.01); *G06N 5/046* (2013.01); *G06N 20/00* (2019.01)

(58) Field of Classification Search
CPC .. G01R 33/482; G01R 33/5618; G06N 3/084; G06N 5/046; G06N 20/00
See application file for complete search history.

(56) References Cited

U.S. PATENT DOCUMENTS

| | | | | |
|---|---|---|---|---|
| 7,738,683 | B2* | 6/2010 | Cahill | G06T 7/0012 382/128 |
| 2017/0309019 | A1* | 10/2017 | Knoll | G01R 33/5611 |
| 2019/0336033 | A1 | 11/2019 | Takeshima | |
| 2020/0090382 | A1* | 3/2020 | Huang | G06N 20/00 |

FOREIGN PATENT DOCUMENTS

JP 2019-093126 A 6/2019

OTHER PUBLICATIONS

Blackmon et al., "Comparison of Fast Spin-Echo Versus Conventional Spin-Echo MRI for Evaluating Meniscal Tears", AJR: 184, 2005, pp. 1740-1743.

* cited by examiner

*Primary Examiner* — Gregory H Curran
(74) *Attorney, Agent, or Firm* — Oblon, McClelland, Maier & Neustadt, L.L.P.

(57) ABSTRACT

According to one embodiment, a data processing apparatus includes processing circuitry. The processing circuitry acquires input data relating to a processing target including a plurality of data segments corresponding respectively to a plurality of imaging contrasts determined by a first pulse sequence. The processing circuitry generates output data relating to the processing target by applying a trained model to input data relating to the processing target. The processing circuitry outputs output data relating to the processing target.

19 Claims, 9 Drawing Sheets

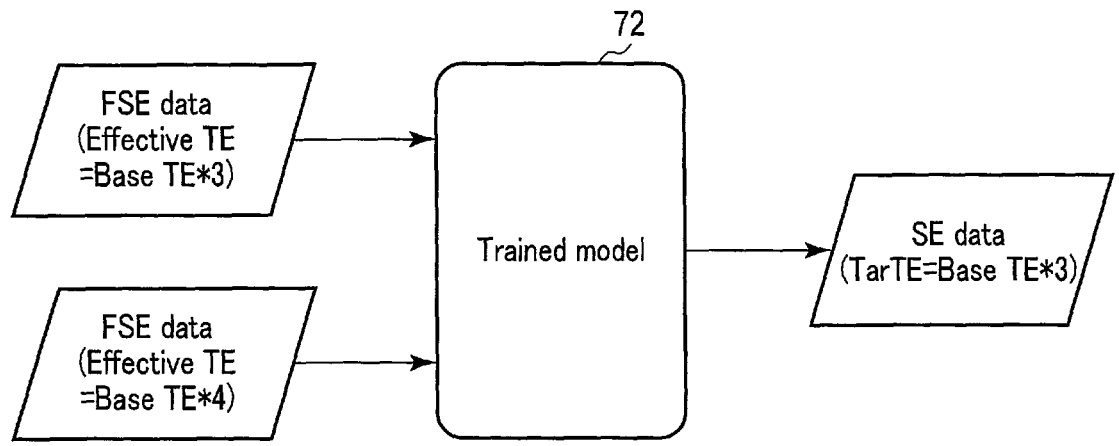
F I G. 10
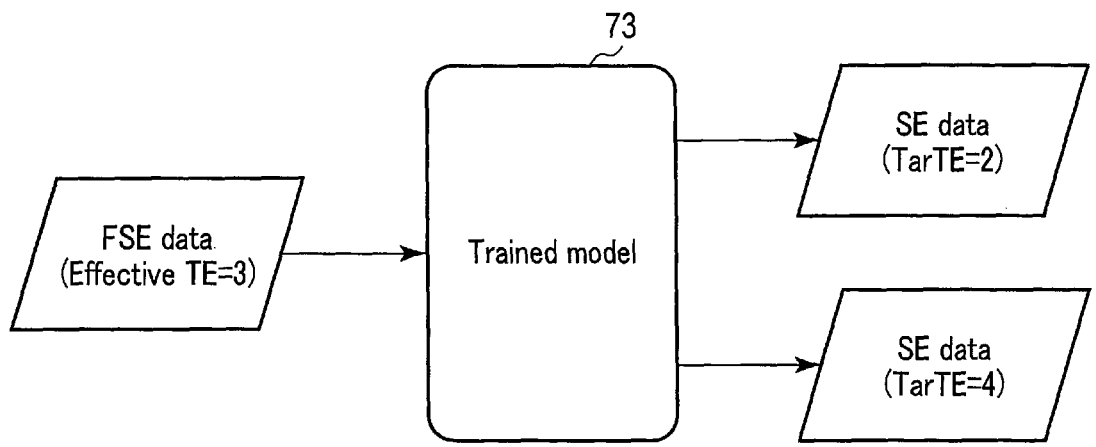
F I G. 11

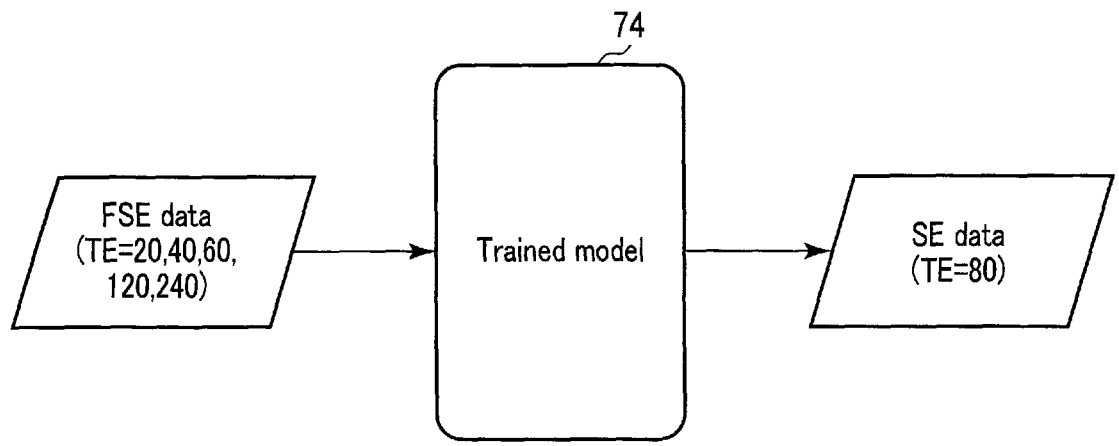
F I G. 12
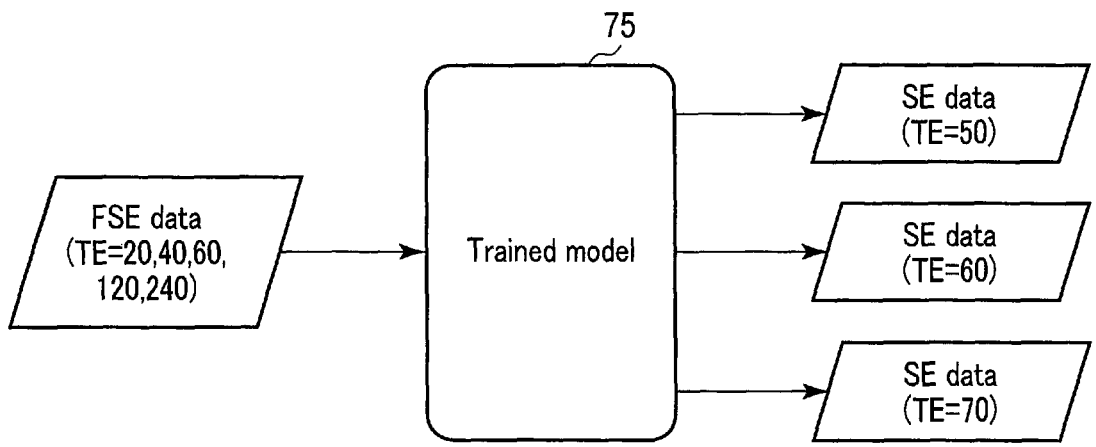
F I G. 13

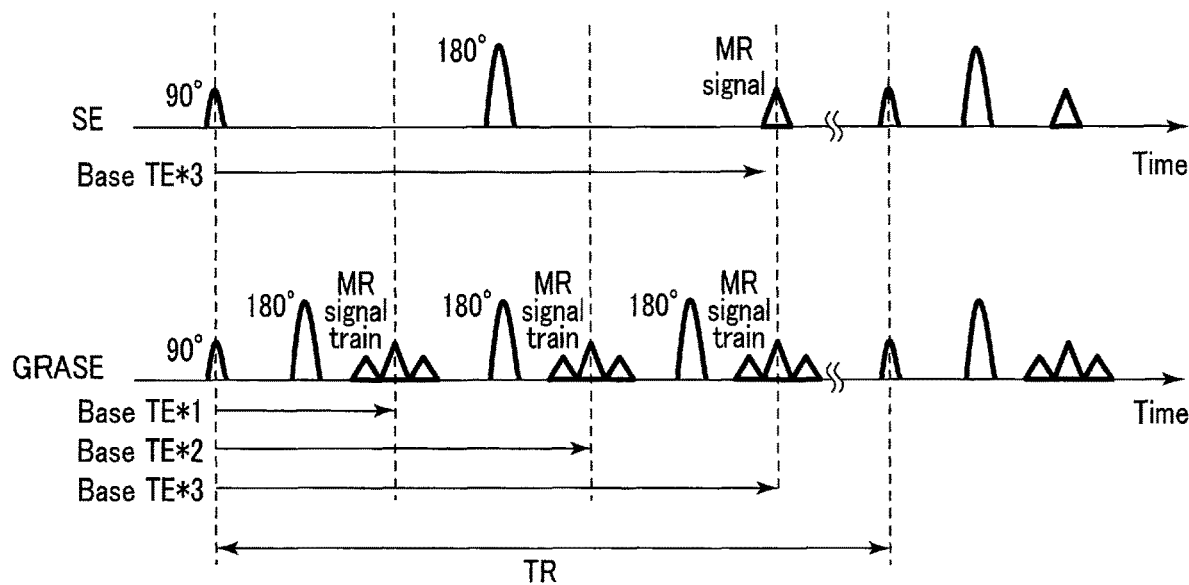
F I G. 14
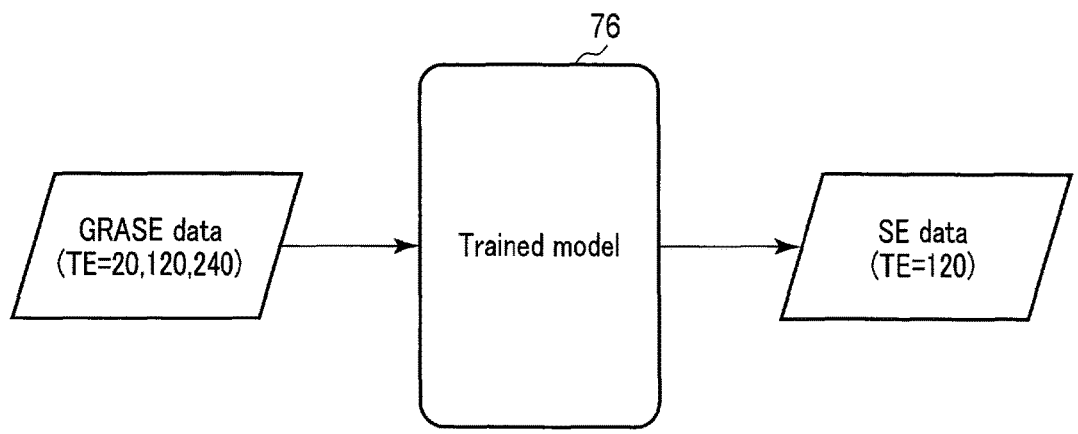
F I G. 15

DATA PROCESSING APPARATUS AND METHOD

CROSS-REFERENCE TO RELATED APPLICATIONS

This application is based upon and claims the benefit of priority from the Japanese Patent Application No. 2019-032901, filed Feb. 26, 2019 the entire contents of which are incorporated herein by reference.

FIELD

Embodiments described herein relate generally to a data processing apparatus and method thereof.

BACKGROUND

For a data acquisition sequence of magnetic resonance imaging, there is a conventional spin echo method (CSE) and a high-speed spin echo method. In the conventional spin echo method, since one MR signal is acquired subsequent to one excitation pulse, an imaging time is comparatively long. However, since a k-space is filled with data of a single echo time, image quality is comparatively high. In the high-speed spin echo method, since a plurality of MR signals are acquired subsequent to one excitation pulse at a different echo time, imaging time is comparatively short. However, since a k-space is filled with data of a plurality of echo times, image quality is comparatively low.

BRIEF DESCRIPTION OF THE DRAWINGS

FIG. 10 is a diagram showing an input/output relationship of a trained model according to modified example 2.

FIG. 11 is a diagram showing an input/output relationship of a trained model according to modified example 3.

FIG. 12 is a diagram showing an input/output relationship of a trained model according to modified example 4.

FIG. 13 is a diagram showing an input/output relationship of a trained model according to modified example 5.

FIG. 14 is a diagram showing pulse sequences of a conventional spin echo method and a GRASE method.

FIG. 15 is a diagram showing an input/output relationship of a trained model according to modified example 6.

DETAILED DESCRIPTION

In general, according to one embodiment, a data processing apparatus comprises processing circuitry. The processing circuitry acquires input data relating to a processing target including a plurality of data segments corresponding respectively to a plurality of imaging contrasts determined by a first pulse sequence. The processing circuitry generates output data relating to the processing target by applying a trained model to the input data relating to the processing target. The trained model is trained based on the input data including a plurality of data segments corresponding respectively to a plurality of imaging contrasts determined by the first pulse sequence and output data corresponding to one or more imaging contrasts determined by a second pulse sequence. The processing circuitry outputs the output data relating to the processing target.

Hereinafter, the data processing apparatus and method according to the present embodiment will be explained with reference to the accompanying drawings.

The data processing apparatus according to the present embodiment is an apparatus that processes medical data generated by a medical image diagnostic apparatus. The medical image diagnostic apparatus may be a single modality apparatus, such as a magnetic resonance imaging (MRI) apparatus, an X-ray computed tomography (CT) apparatus, an X-ray diagnostic apparatus, a positron emission tomography (PET) apparatus, a single photon emission CT (SPECT) apparatus, and an ultrasound diagnostic apparatus, or may be a combined modality apparatus, such as a PET/CT apparatus, a SPECT/CT apparatus, a PET/MRI apparatus, and a SPECT/MRI apparatus. The data processing apparatus may be a computer that is separate from the medical image diagnostic apparatus, or may be a computer that is embedded in the medical image diagnostic apparatus. The data processing apparatus may also be a processor that performs a calculation process.

Hereinafter, detailed explanations will be provided by assuming that the data processing apparatus according to the present embodiment is a computer embedded in a magnetic resonance imaging apparatus.

Figure 1:
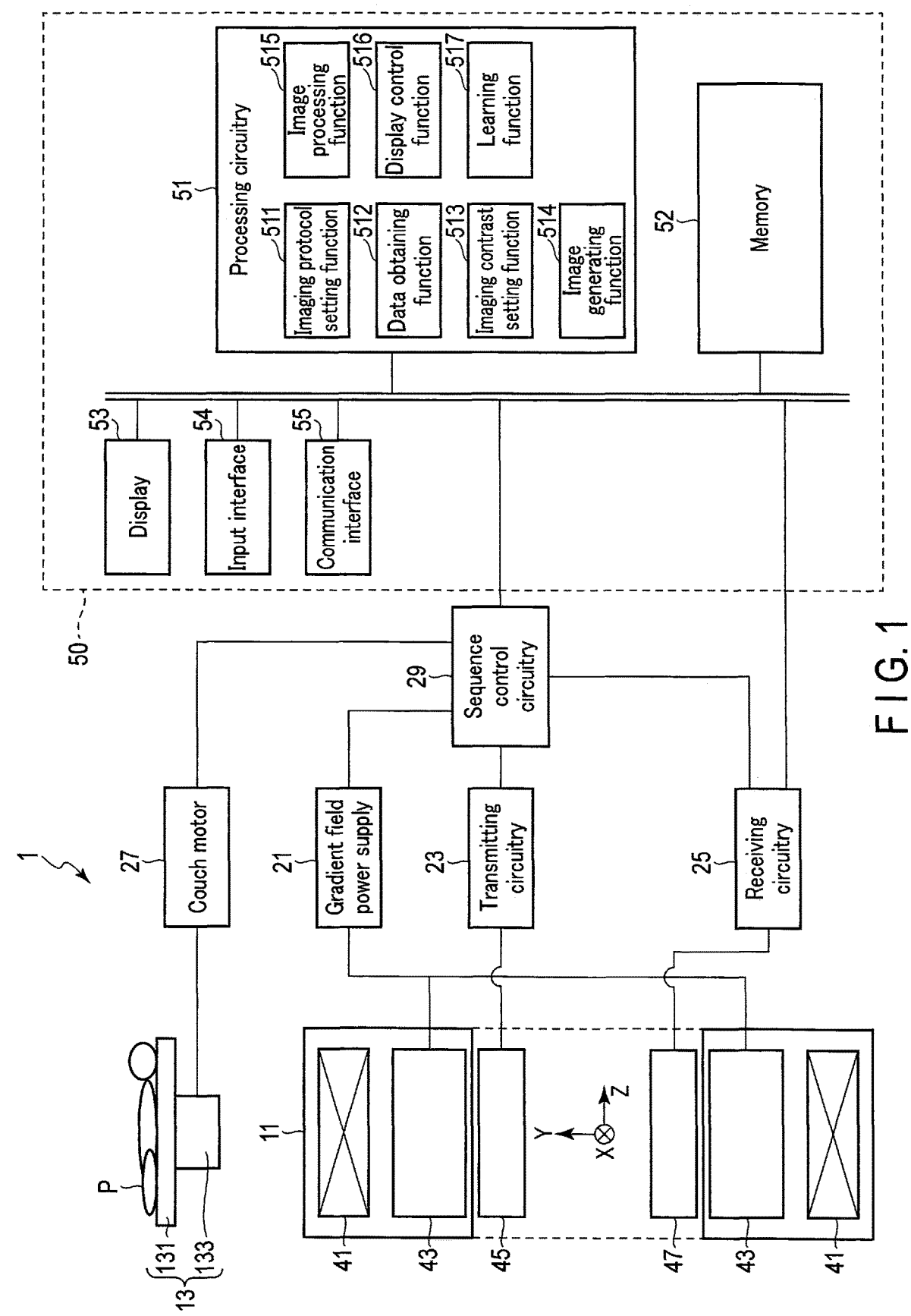
FIG. 1 is a diagram showing a configuration of a magnetic resonance imaging apparatus according to a present embodiment.

FIG. 1 is a diagram showing a configuration of a magnetic resonance imaging apparatus 1 according to the present embodiment. As shown in FIG. 1, the magnetic resonance imaging apparatus 1 includes a gantry 11, a couch 13, a gradient field power supply 21, transmitting circuitry 23, receiving circuitry 25, a couch motor 27, sequence control circuitry 29, and a host computer 50. The host computer is an example of the data processing apparatus.

The gantry 11 includes a static field magnet 41 and a gradient field coil 43. The static field magnet 41 and the gradient field coil 43 are accommodated in the housing of the gantry 11. The housing of the gantry 11 is formed with a bore having a hollow shape. A transmitting coil 45 and a receiving coil 47 are disposed in the bore of the gantry 11.

The static field magnet 41 has a hollow substantially cylindrical shape and generates a static magnetic field inside a substantially cylindrical interior. Examples of the static field magnet 41 used include a permanent magnet, a superconducting magnet or a normal conducting magnet. Here, a central axis of the static field magnet 41 is defined as a Z axis, an axis vertically perpendicular to the Z axis is defined as a Y axis, and an axis horizontally perpendicular to the Z axis is defined as an X axis. The X axis, the Y axis and the Z axis constitute an orthogonal three-dimensional coordinate system.

The gradient field coil 43 is a coil unit attached to the inside of the static field magnet 41 and formed in a hollow substantially cylindrical shape. The gradient field coil 43 receives supply of a current from the gradient field power supply 21 to generate a gradient field. More specifically, the gradient field coil 43 has three coils corresponding to the X axis, the Y axis, and the Z axis orthogonal to each other. The three coils form a gradient field in which the magnetic field strength changes along the X axis, the Y axis, and the Z axis, respectively. The gradient fields along each of the X axis, the Y axis, and the Z axis are combined to form a slice selection gradient field Gs, a phase encoding gradient field Gp, and a frequency encoding gradient field Gr that are orthogonal to each other in desired directions. The slice selection gradient field Gs is used to determine an imaging slice as appropriate. The phase encoding gradient field Gp is used to change a phase of a magnetic resonance signal (hereinafter, referred to as an MR signal) according to a spatial position. The frequency encoding gradient field Gr is used to change a frequency of the MR signal according to the spatial position. In the following explanation, a direction in which the slice selection gradient field Gs is a gradient will be referred to as the Z axis, a direction in which the phase encoding gradient field Gp is a gradient will be referred to as the Y axis, and a direction in which the frequency encoding gradient field Gr is a gradient will be referred to as the X axis.

The gradient field power supply 21 supplies a current to the gradient field coil 43 in accordance with a sequence control signal from the sequence control circuitry 29. The gradient field power supply 21 supplies a current to the gradient field coil 43 and causes the gradient field coil 43 to generate a gradient field along each of the X axis, Y axis, and Z axis. The gradient field is superimposed on the static magnetic field formed by the static field magnet 41 and is applied to a subject P.

The transmitting coil 45 is disposed, for example, inside the gradient field coil 43, and receives supply of a current from the transmitting circuitry 23 to generate a high frequency pulse (hereinafter, referred to as an RF pulse).

The transmitting circuitry 23 supplies a current to the transmitting coil 45 in order to apply the RF pulse for exciting a target proton in the subject P to the subject P via the transmitting coil 45. The RF pulse oscillates at a resonance frequency specific to the target proton to excite the target proton. An MR signal is generated from the excited target proton and is detected by the receiving coil 47. The transmitting coil 45 is, for example, a whole-body coil (WB coil). The whole-body coil may be used as a transmitting and receiving coil.

The receiving coil 47 receives the MR signal emitted from the target proton present in the subject P due to the action of the RF pulse. The receiving coil 47 has a plurality of receiving coil elements capable of receiving the MR signal. The received MR signal is supplied to the receiving circuitry 25 via wire, or wirelessly. Although not shown in FIG. 1, the receiving coil 47 has a plurality of receiving channels implemented in parallel. The receiving channels each include receiving coil elements that receive the MR signal, an amplifier that amplifies the MR signal, and the like. The MR signal is output for each receiving channel. The total number of the receiving channels and the total number of the receiving coil elements may be the same, or the total number of the receiving channels may be larger or smaller than the total number of the receiving coil elements.

The receiving circuitry 25 receives the MR signal generated from the excited target proton via the receiving coil 47. The receiving circuitry 25 processes the received MR signal to generate a digital MR signal. The digital MR signal can be expressed in k-space defined by a spatial frequency. Therefore, hereinafter, the digital MR signal will be referred to as k-space data. The k-space data is a type of raw data to be provided for image reconstruction. The k-space data is supplied to the host computer 50 via wire, or wirelessly.

It should be noted that the transmitting coil 45 and the receiving coil 47 described above are merely examples. Instead of the transmitting coil 45 and the receiving coil 47, a transmitting and receiving coil having a transmitting function and a receiving function may be used. Also, the transmitting coil 45, the receiving coil 47, and the transmitting and receiving coil may be combined.

The couch 13 is installed adjacent to the gantry 11. The couch 13 has a table top 131 and a base 133. The subject P is placed on the table top 131. The base 133 slidably supports the table top 131 along each of the X axis, the Y axis, and the Z axis. The couch motor 27 is accommodated in the base 133. The couch motor 27 moves the table top 131 under the control of the sequence control circuitry 29. The couch motor 27 may, for example, include any motor such as a servo motor or a stepping motor.

The sequence control circuitry 29 has a processor of a central processing unit (CPU) or a micro processing unit (MPU) and a memory such as a read only memory (ROM) or a random access memory (RAM) as hardware resources. The sequence control circuitry 29 synchronously controls the gradient field power supply 21, the transmitting circuitry 23, and the receiving circuitry 25 based on the imaging protocol determined by an imaging protocol setting function 511 of the processing circuitry 51, executes magnetic resonance imaging on the subject P in accordance with a pulse sequence corresponding to the imaging protocol, and acquires the k-space data relating to the subject P.

As shown in FIG. 1, the host computer 50 is a computer having processing circuitry 51, a memory 52, display 53, an input interface 54, and a communication interface 55.

The processing circuitry 51 includes, as hardware resources, a processor such as a CPU. The processing circuitry 51 functions as the core of the magnetic resonance imaging apparatus 1. For example, by executing various programs, the processing circuitry 51 realizes the imaging protocol setting function 511, a data obtaining function 512, an imaging contrast setting function 513, an image generating function 514, an image processing function 515, a display control function 516, and a learning function 517.

In the imaging protocol setting function 511, the processing circuitry 51 sets an imaging protocol relating to magnetic resonance imaging automatically, or by a user instruction via the input interface 54. The imaging protocol is a set of various imaging parameters related to one magnetic resonance imaging. Various parameters may be applied as the imaging parameters, including types of pulse sequences, types of k-space filling methods, imaging time, repetition time (TR), and echo time (TE), etc. set directly or indirectly to perform magnetic resonance imaging.

In the data obtaining function 512, the processing circuitry 51 obtains MR data including a plurality of data segments that correspond respectively to a plurality of imaging contrasts relating to the processing target such as the subject P. The MR data is a generic term of k-space data, MR image data, and hybrid data. The k-space data may be original k-space data, or may be data obtained by performing appropriate data processing, such as data compression processing, resolution decomposition processing, data interpolation processing, and resolution composite processing, on the original k-space data. The hybrid data is data generated by executing Fourier transform or inverse Fourier transform, etc. along at least one axis of the k-space data. The data segments are a set of data corresponding to each imaging contrast. More specifically, data corresponding to one imaging contrast is included only in a corresponding data segment, and is not included in the other data segments. The contrast of the MR image is determined by multiple factors such as a T1 value and a T2 value. The imaging contrast is a factor that determines the contrast of the MR image, and is determined by, for example, a particular imaging parameter among various imaging parameters of magnetic resonance imaging.

In the imaging contrast setting function 513, the processing circuitry 51 sets the imaging contrast of MR data to be output by the image generating function 514 mentioned later.

In the image generating function 514, the processing circuitry 51 applies a trained model to input data relating to the processing target, and generates output data relating to such a processing target. The trained model is a machine learning model that is trained based on input data including a plurality of data segments corresponding respectively to a plurality of imaging contrasts and output data corresponding to a single imaging contrast. The machine learning model according to the present embodiment is assumed, typically, to be a deep neural network (DNN), which is a multiple-layer network model simulating neural network of a brain of a living being. The DNN includes a composite function with parameters that are defined by a combination of a plurality of adjustable functions and parameters. The relationship between input MR data and output MR data includes various aspects. For example, k-space data may be set for both the input and the output, MR image data may be set for both the input and output, and k-space data may be set for the input, and MR image data may be set for the output. In the image generating function 514, the processing circuitry 51 may also generate MR image data by performing Fourier transform or inverse Fourier transform on the k-space data.

As an example, a high-speed spin echo method is adopted as the pulse sequence for acquiring input MR data including a plurality of data segments corresponding respectively to a plurality of imaging contrasts, and a conventional spin echo method (CSE) is adopted as the pulse sequence for acquiring output MR data corresponding to a single imaging contrast. The high-speed spin echo method is also referred to as a fast spin echo (FSE) method or a turbo spin echo (TSE) method. The conventional spin echo method will be described merely as SE, and the high-speed spin echo method will be described as FSE. The high-speed spin echo method and the conventional spin echo method can be executed by the sequence control circuitry 29.

Figure 2:
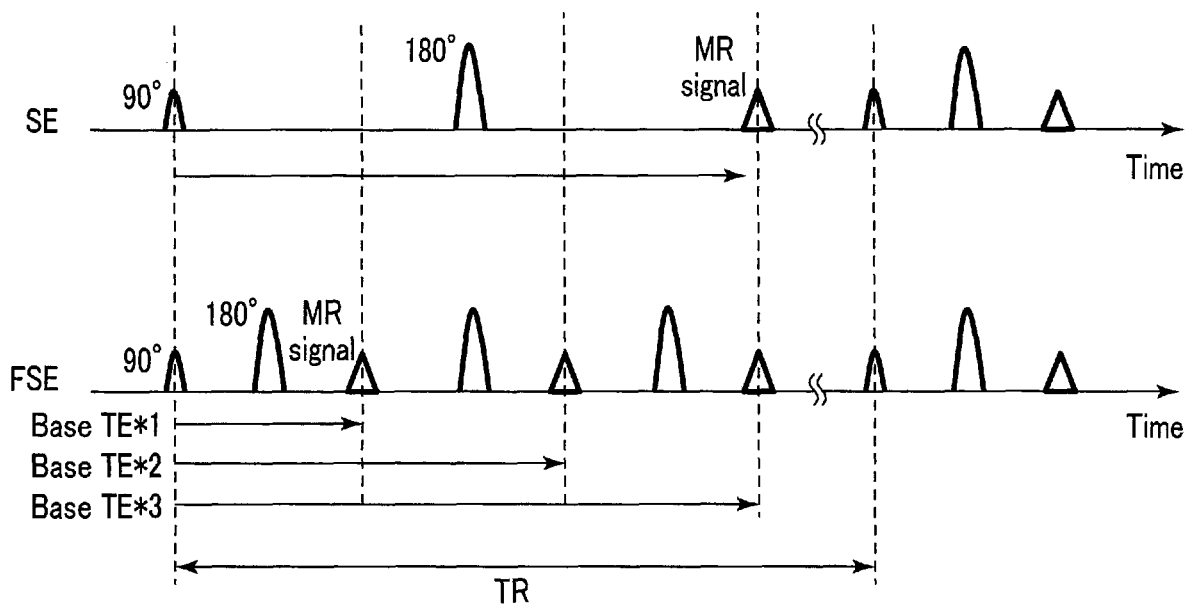
FIG. 2 is a diagram showing pulse sequences of a conventional spin echo method and a high-speed spin echo method.

FIG. 2 is a diagram showing pulse sequences of the conventional spin echo method and the high-speed spin echo method. As shown in FIG. 2, the conventional spin echo method is a pulse sequence that acquires one MR signal (spin echo signal) by applying a 90° excitation pulse and, subsequently, a 180° refocusing pulse. A time from when the 90° excitation pulse is applied to when the next 90° excitation pulse is applied is referred to as a repetition time (TR). A time from when the 90° excitation pulse is applied to which the MR signal is generated is referred to as an echo time (TE). The echo time (TE) is one of the factors that determines the imaging contrast. In the conventional spin echo method, a single MR signal is acquired at one repetition time. That is, in the conventional spin echo method, since the k-space is filled with k-space data of a single echo time (TE), the image quality is comparatively high, and the imaging time is comparatively long.

The high-speed spin echo method is a pulse sequence that acquires a plurality of MR signals (spin echo signals) by applying a 90° excitation pulse and, subsequently, a plurality of 180° refocusing pulses. In the high-speed spin echo method, a plurality of MR signals with different echo times are acquired at one repetition time. That is, in the high-speed spin echo method, since the k-space is filled with k-space data of a plurality of echo times, the image quality is comparatively low, and the imaging time is comparatively short.

Here, as shown in FIG. 2, in the high-speed spin echo method, an echo time from when the 90° excitation pulse is applied to when the MR signal is generated is described as a base TE or a base TE*1. An echo time from when the 90° excitation pulse is applied to when the nth ("n" is an integer) MR signal is generated is described as a base TE*n. In the high-speed spin echo method, an echo time relating to an MR signal corresponding to the center of the k-space is referred to as an effective echo time. In FIG. 2, as an example, the effective echo time is described as being equal to a base TE*3. The echo time in the conventional spin echo method will be referred to as a target TE in the present embodiment. In FIG. 2, the target TE in the conventional spin echo method is set to base TE*3, which is equal to the effective echo time in the high-speed spin echo method; however, this may be set to any echo time other than the effective echo time.

In the excitation pulse shown in FIG. 2, an angle at which magnetization is tilted is 90°; however, the angle is not limited thereto, and may be any, angle. In the refocusing pulse shown in FIG. 2, an angle at which magnetization is tilted is 180°; however, as long as it is equal to or larger than 90°, the angle is not limited thereto, and may be any angle. Furthermore, the excitation pulse, the refocusing pulse, and the MR signal shown in FIG. 2 have a pulse shape. However, since FIG. 2 is a schematic diagram, the actual shape may be any shape, such as a sinc shape or a rectangular shape.

Figure 3:
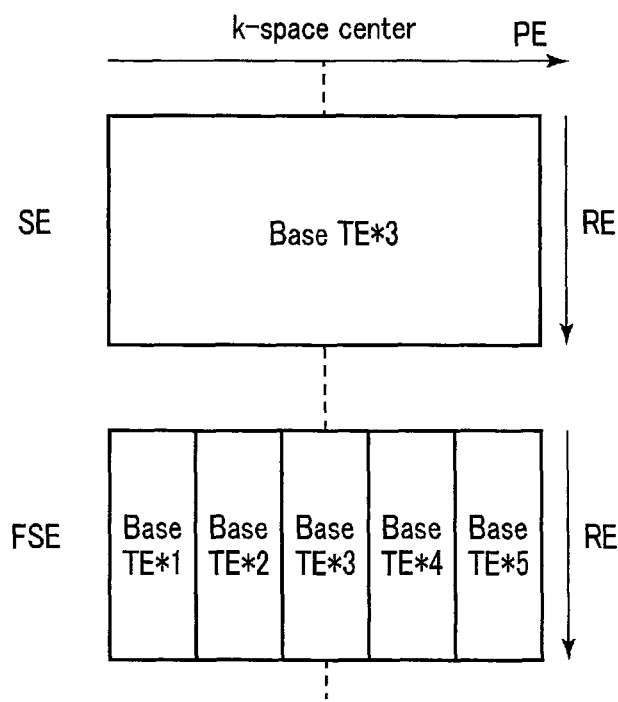
FIG. 3 is a diagram showing data segments of k-space data of the conventional spin echo method and the high-speed spin echo method in the case of FIG. 2.

FIG. 3 is a diagram showing data segments of the k-space data of the conventional spin echo method and the high-speed spin echo method in the case of FIG. 2. In FIG. 3, a two-dimensional Cartesian scan is given as an example of the type of k-space filling method. The k-space is defined by a phase encode PE and a frequency encode RE. Furthermore, in the high-speed spin echo method, the number of MR signals to be generated by applying one 90° excitation pulse, that is, an echo train length (ETL), is five.

As shown in FIG. 3, since the echo time for all of the MR signals is the same in the conventional spin echo method, the k-space is filled with only the k-space data of the base TE*3, which is the target TE. On the other hand, in the high-speed spin echo method, the k-space is filled with a data segment of the base TE*1, a data segment of the base TE*2, a data segment of the base TE*3, a data segment of the base TE*4, and a data segment of the base TE*5. Therefore, the k-space data acquired by the high-speed spin echo method is a data set including a plurality of data segments corresponding respectively to a plurality of imaging contrasts.

The high-speed spin echo method in the present embodiment may be any pulse sequence as long as it is a pulse sequence that acquires a plurality of MR signals (spin echo signals) by applying an excitation pulse and, subsequently, a plurality of refocusing pulses. For example, as the high-speed spin echo method, synthetic MRI, such as Quantification of Relaxation Times and Proton Density by Multi-echo Acquisition of Saturation-recovery Using Turbo Spin-echo Readout (QRAP-MASTER), may be used. Furthermore, the type of k-space filling method is not limited to the two-dimensional Cartesian scan, and may also be a three-dimensional Cartesian scan. Furthermore, the type of k-space filling method may be a two-dimensional or a three-dimensional radial scan or spiral scan, or may be PROPELLER or stack of stars, etc. Furthermore, in order to acquire all of one set of k-space data, the high-speed spin echo method may adopt multishots, which require a plurality of excitation pulses, or a single shot, which requires only one excitation pulse.

The conventional spin echo method and the high-speed spin echo method according to the present embodiment may be a single slice method which performs selective excitation for one slice at one repetition time, or may be a multi-slice method which performs selective excitation for a plurality of slices.

Figure 4:
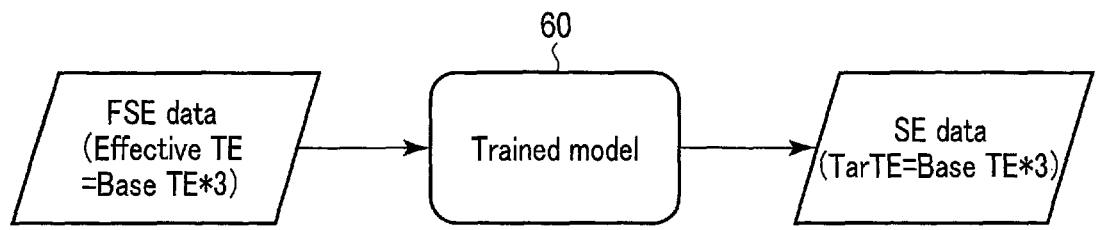
FIG. 4 is a diagram showing an example of input/output of a trained model used in an image generating function of FIG. 1.

FIG. 4 is a diagram showing an example of input/output of a trained model 60 used in the image generating function 514. As shown in FIG. 4, as the input MR data including a plurality of data segments corresponding respectively to a plurality of imaging contrasts, the k-space data including a plurality of data segments corresponding respectively to a plurality of TEs and acquired by the high-speed spin echo, or MR image data based on such k-space data, is input to the trained model 60. The input is not limited to the k-space data and the MR image data, and may also be hybrid data. Hereinafter, the k-space data, the hybrid data, or the MR image data acquired by the high-speed spin echo method will collectively be referred to as FSE data. As the output MR data corresponding to a single imaging contrast among a plurality of imaging contrasts, the trained model 60 outputs the k-space data corresponding to a single TE (target TE) among a plurality of TEs and acquired by the conventional spin echo method, or MR image data based on such k-space data. The output is not limited to the k-space data and the MR image data, and may also be hybrid data. Hereinafter, the k-space data, the hybrid data, or the MR image data acquired by the conventional spin echo method will collectively be referred to as SE data.

For example, in the case of the FSE and the SE shown in FIG. 3, five types of TEs, which are the base TE*1, the base TE*2, the base TE*3, the base TE*4, and the base TE*5, are set as a plurality of TEs relating to the FSE data. In this case, the FSE data in which the data segments of the base TE*1, the base TE*2, the base TE*3, the base TE*4, and the base TE*5 are mixed is input to the trained model 60 as the input MR data. As the single TE relating to the SE data, one of the base TE*1, the base TE*2, the base TE*3, the base TE*4, and the base TE*5 relating to the FSE data is set. For example, the base TE*3, which is an effective TE among the five types of TE, may be set as the target TE (Tar TE), or any TE other than the effective TEs may be set as the target TE. In this manner, since the SE data, which is the output data of the trained model 60, includes data of a part of the echo time among a plurality of echo times of the FSE data, which is the input data, the FSE data which is the input data and the SE data which is the output data may be considered to be correlated. The trained model 60 is generated for each target TE, and is stored in the memory 52.

The DNN according to the present embodiment may have any structure. For example, the DNN according to the present embodiment includes an input layer, an output layer, and an intermediate layer. The intermediate layer includes at least one or more convolutional neural network (CNN) layers, all combined layers, and a pooling layer, etc. The DNN may have a network structure of, for example, a residual network (ResNet), a dense convolutional network (DenseNet), and a U-Net.

In the image processing function 515, the processing circuitry 51 performs various types of image processing on the MR image. For example, the processing circuitry 51 performs image processing such as volume rendering, surface rendering, pixel value projection processing, multi-planer reconstruction (MPR) processing, curved MPR (CPR) processing, and the like.

In the display control function 516, the processing circuitry 51 displays various types of information on the display 53. For example, the processing circuitry 51 displays the MR image generated by the image generating function 514, the MR image generated by the image processing function 515, and a setting screen of an imaging protocol, and the like on the display 53.

In the learning function 517, the processing circuitry 51 generates a trained model that is trained based on input data including a plurality of data segments corresponding respectively to a plurality of imaging contrasts and output data corresponding to a single imaging contrast among the plurality of imaging contrasts. For example, the processing circuitry 51 generates the trained model by supervised machine learning that uses input data including a plurality of data segments corresponding respectively to a plurality of imaging contrasts and output data corresponding to a single imaging contrast among the plurality of imaging contrasts as supervising data. A plurality of sets of supervising data for various processing targets are acquired by various magnetic resonance imaging apparatuses. The processing target is the same for the combination of the input data and the output data belonging to the same supervising data. For example, in the case of FIG. 4, the combination of the FSE data and the SE data relating to the same subject is used as the supervising data.

The memory 52 is a storage apparatus such as a hard disk drive (HDD), a solid state drive (SSD), an integrated circuitry storage apparatus or the like that stores various information. The memory 52 may also be a drive apparatus or the like that reads and writes various information from and to a portable storage medium such as a CD-ROM drive, a DVD drive, a flash memory, and the like. For example, the memory 52 stores a trained model, a k-space data, an MR image data, a control program, and the like.

The display 53 displays various types of information by the display control function 516. For example, the display 53 displays the MR image generated by the image generating function 514, the MR image generated by the image processing function 515, and a setting screen of the imaging protocol, and the like. Examples of appropriate displays 53 that can be used include a CRT display, a liquid crystal display, an organic EL display, an LED display, a plasma display, or any other display known in the art.

The input interface 54 includes an input apparatus that receives various commands from the user. Examples of the input apparatus that can be used include a keyboard, a mouse, various switches, a touch screen, a touch pad, and the like. It should be noted that the input apparatus is not limited to those having physical operation parts such as a mouse and a keyboard. For example, examples of the input interface 54 also include electrical signal processing circuitry that receives an electrical signal corresponding to an input operation from an external input apparatus provided separately from the magnetic resonance imaging apparatus 1, and outputs the received electrical signal to various types of circuitry.

The communication interface 55 is an interface connecting the magnetic resonance imaging apparatus 1 with a workstation, a picture archiving and communication system (PACS), a hospital information system (HIS), a radiology information system (RIS), and the like via a local area network (LAN) or the like. The network IF transmits and receives various information to and from the connected workstation, PACS, HIS and RIS.

It should be noted that the above configuration is merely an example, and the present invention is not limited thereto. For example, the sequence control circuitry 29 may be embedded in the host computer 50. The sequence control circuitry 29 and the processing circuitry 51 may also be mounted on the same substrate. The learning function 517 does not necessarily have to be mounted on the processing circuitry 51 of the resonance imaging apparatus 1. For example, the learning function 517 should at least be mounted on a computer for generating a trained model, which is a different body from the magnetic resonance imaging apparatus 1. In this case, the trained model 60 generated by the computer is supplied to the magnetic resonance imaging apparatus 1 via a network or a portable storage medium, etc. Furthermore, the storage area of the trained model 60 in the memory 52 does not necessarily have to be mounted on the magnetic resonance imaging apparatus 1, and may be mounted on, for example, a storage apparatus connected to the magnetic resonance imaging apparatus 1 via a network.

Hereinafter, an operation example of the magnetic resonance imaging apparatus 1 according to the present embodiment will be explained.

Figure 5:
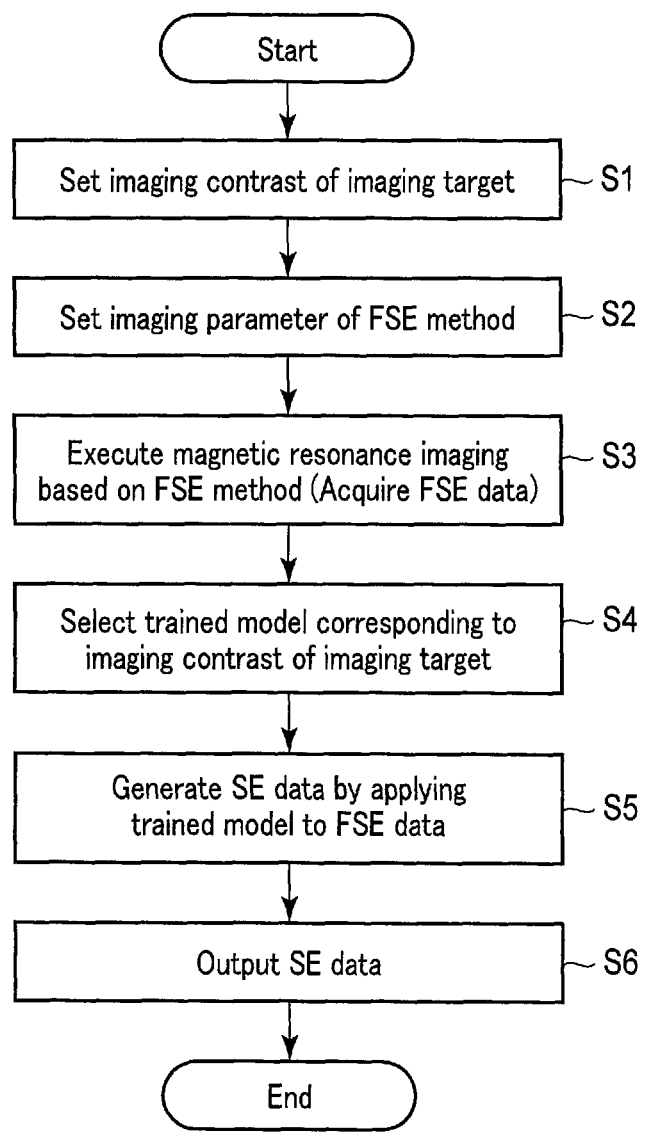
FIG. 5 is a diagram showing a typical flow of an MR examination performed by the magnetic resonance imaging apparatus according to the present embodiment.

FIG. 5 is a diagram showing a typical flow of an MR examination performed by the magnetic resonance imaging apparatus 1 according to the present embodiment.

As shown in FIG. 5, the processing circuitry 51 sets the imaging contrast of an imaging target by performing the imaging contrast setting function 513 (step S1). Specifically, the processing circuitry 51 sets an echo time of the imaging target (target TE) as the imaging contrast of the imaging target. The echo time of the imaging target may be any echo time that is designated by a user via the input interface 54.

After step S1, the processing circuitry 51 sets an imaging parameter of an FSE method by performing the imaging protocol setting function 511 (step S2). In step S2, the processing circuitry 51 sets the imaging time, the repetition time, the echo time, and the ETL, etc., which are the imaging parameters of the FSE method, via the input interface 54 or automatically. The echo time is set for each MR signal configuring the ETL. For example, the processing circuitry 51 may directly set the effective echo time in accordance with an instruction by a user via the input interface 54, or may automatically set the effective echo time based on the reference echo time and an order of a phase encode corresponding to the effective echo time (the number of encodes from the initial MR signal to the MR signal corresponding to the effective echo time). The other echo times may be set automatically based on the effective echo time and the ETL. The set imaging parameter is supplied to the sequence control circuitry 29.

After step S2, the sequence control circuitry 29 executes magnetic resonance imaging based on the FSE method in accordance with the imaging parameter set in step S2 (step S3). In step S3, the sequence control circuitry 29 executes magnetic resonance imaging on the subject P based on the FSE method. The receiving circuitry 25 receives a plurality of MR signals corresponding respectively to a plurality of echo times. A plurality of data segments that correspond respectively to the plurality of MR signals are stored in the memory 52 as the k-space data. The k-space data acquired by the FSE method is a type of FSE data. For example, in the case where ETL is five, at least one set of k-space data including data segments of the base TE*1, the base TE*2, the base TE*3, the base TE*4, and the base TE*5 is acquired.

After step S3, the processing circuitry 51 selects the trained model 60 that corresponds to the imaging contrast of the imaging target (target TE) by performing the image generating function 514 (step S4). A plurality of trained models 60 relating to a plurality of target TEs are stored in advance in the memory 52. For example, an identifier relating to the target TE is associated with each of the plurality of trained models. The processing circuitry 51 selects the trained model 60 associated with the identifier relating to the target TE set in step S1 from among the plurality of trained models stored in the memory 52.

After step S4, by performing the image generating function 514, the processing circuitry 51 applies the trained model 60 selected in step S4 to the FSE data acquired in step S5, and generates the SE data relating to the target TE set in step S1 (step S5). A case in which the FSE data and the SE data are both the k-space data will be explained. The k-space data relating to the FSE method will be referred to as FSE k-space data, and the k-space data relating to the SE method will be referred to as SE k-space data.

In step S5, the processing circuitry 51 applies the trained model 60 to the FSE k-space data and generates the SE k-space data relating to the target TE. For example, one set of SE k-space data relating to the target TE of the base TE*3, etc. is generated from one set of FSE k-space data in which data segments of the base TE*1, the base TE*2, the base TE*3, the base TE*4, and the base TE*5 are mixed. All of the data segments configuring the generated SE k-space data will include the k-space data corresponding to the base TE*3. Subsequently, the processing circuitry 51 performs Fourier transform on the SE k-space data relating to the generated target TE, and generates the MR image data relating to the target TE (hereinafter, referred to as SE image data). Since the generated SE image data is generated by the trained model 60, it has approximately the same image quality as that obtained by the SE method.

The Architecture of the trained model 60 can be variously modified. For example, the trained model 60 may include a single DNN layer that executes process on all of the data segments. The trained model 60 may also include a plurality of DNN layers that execute processes corresponding respectively to a plurality of data segments. Hereinafter, individual DNN layers handling processing corresponding to each data segment will be referred to as a sub-DNN layer.

Figure 6:
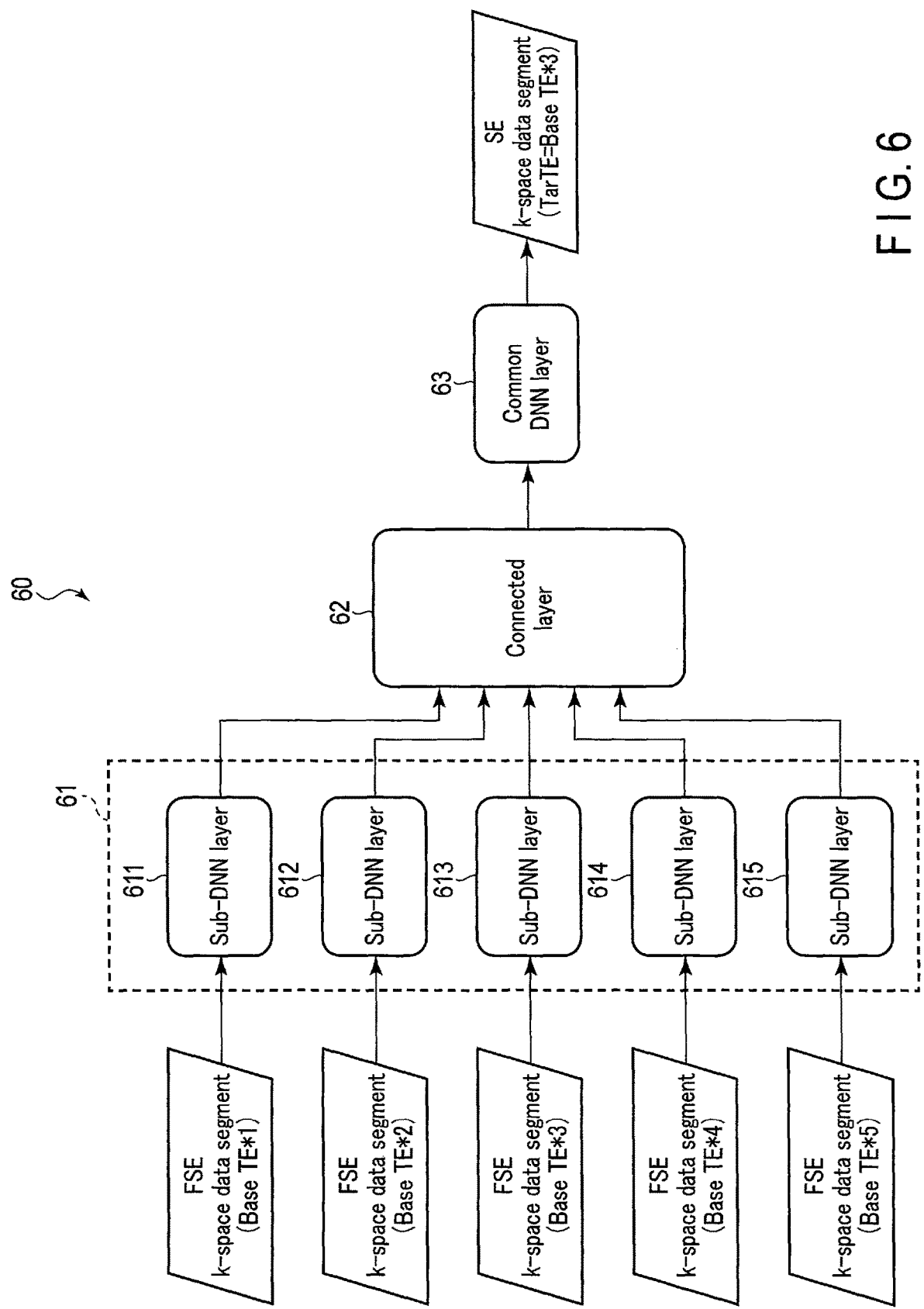
FIG. 6 is a diagram schematically showing a structure and input/output of a trained model including a sub-DNN layer.

FIG. 6 is a diagram schematically showing a structure and input/output of the trained model 60 including a sub-DNN layer 61. As its input, the trained model 60 has one set of FSE k-space data in which data segments of the base TE*1, the base TE*2, the base TE*3, the base TE*4, and the base TE*5 are mixed, and outputs one set of SE k-space data relating to the target TE of the base TE*3, etc. As shown in FIG. 6, the trained model 60 includes the sub-DNN layer 61, a connected layer 62, and a common DNN layer 63. The sub-DNN layer 61 includes n layers of sub-DNN layer 61n ("n" is an integer) which correspond respectively to n segments of k-space data segments. The sub-DNN layer 61n executes processing with respect to the corresponding k-space data segment. The connected layer 62 is connected to n layers of sub-DNN layer 61n. The connected layer 62 combines n sets of output data from n layers of sub-DNN layer 61n, and generates one set of output data. The connected layer 62 may be realized by, for example, concatenate function (or operation), etc. The common DNN layer 63 executes processing with respect to one set of output data from the connected layer 62.

As shown in FIG. 6, the processing circuitry 51 divides the FSE k-space data set into k-space data segments of the base TE*1, the base TE*21 the base TE*3, the base TE*4, and the base TE*5. The processing circuitry 51 propagates the k-space data segment of the base TE*n in the order of the sub-DNN layer 61n, the connected layer 62, and the common DNN layer 63, and generates one set of SE k-space data relating to the target TE of the base TE*3, etc. In this manner, by sharing the task of conversion processing from the FSE k-space data set to the SE k-space data set that is performed by the trained model 60 with the sub-DNN layer 61 and the common DNN layer 63, improvement in accuracy and learning efficiency of the SE k-space data set can be expected.

A case in which the FSE data and the SE data are both MR image data will be explained. The MR image data relating to the FSE method will be referred to as FSE image data.

Figure 7:
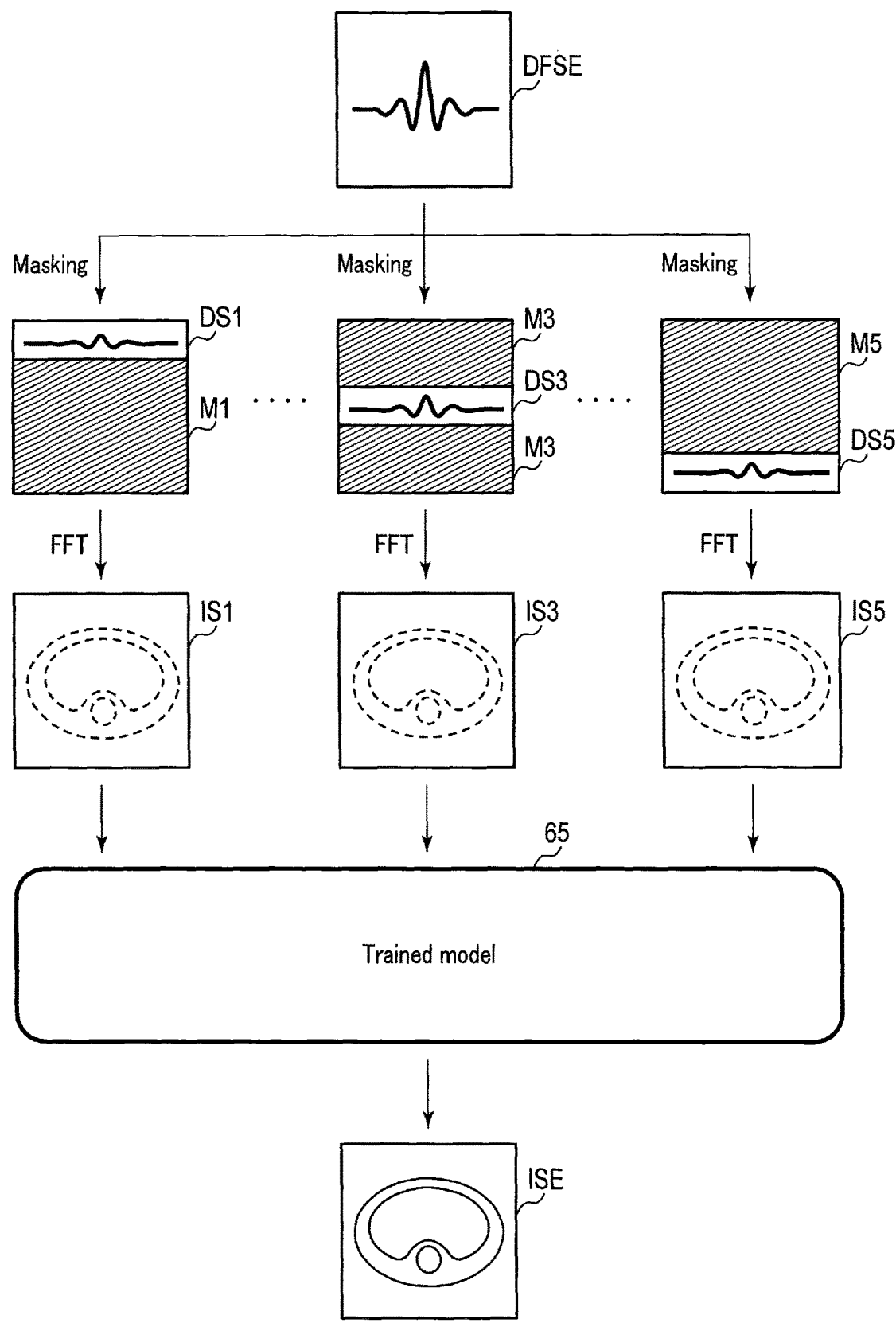
FIG. 7 is a diagram schematically showing a generating process of SE image data by using the trained model.

FIG. 7 is a diagram schematically showing a generating process of the SE image data by using a trained model 65. The trained model 65 is a machine learning model that is trained based on input data including a plurality of MR image data segments corresponding respectively to a plurality of echo times and an MR image data segment corresponding to a single echo time among the plurality of echo times. (target TE).

As shown in FIG. 7, the processing circuitry 51 copies an FSE k-space data set DFSE by the number of ETLs and generates a plurality of k-space data segments corresponding respectively to a plurality of echo times. The processing circuitry 51 then applies mask processing to each k-space data segment, and applies a mask Mn (n is an integer that identifies the echo time) to the k-space data segment corresponding to the echo time other than the k-space data segment Dkn (n is an integer that identifies the echo time) corresponding to each echo time. The mask Mn is applied by allocating a predetermined value, such as zero, to each sample point of the k-space data segment of a mask target. The processing circuitry 51 then applies reconstruction processing of FFT, etc. to each k-space data segment Dkn, and generates FSE image data ISn (n is an integer that identifies the echo time) corresponding to each echo time. The processing circuitry 51 then applies the trained model 65 to a plurality of pieces of FSE image data ISn corresponding respectively to a plurality of echo times, and generates an SE image data ISE corresponding to the target TE among the plurality of echo times.

After step S5, the processing circuitry 51 outputs the SE data generated in step S5 (step S6). For example, the processing circuitry 51 displays the SE image data as the SE data on the display 53 by performing the display control function 516.

Figure 8:
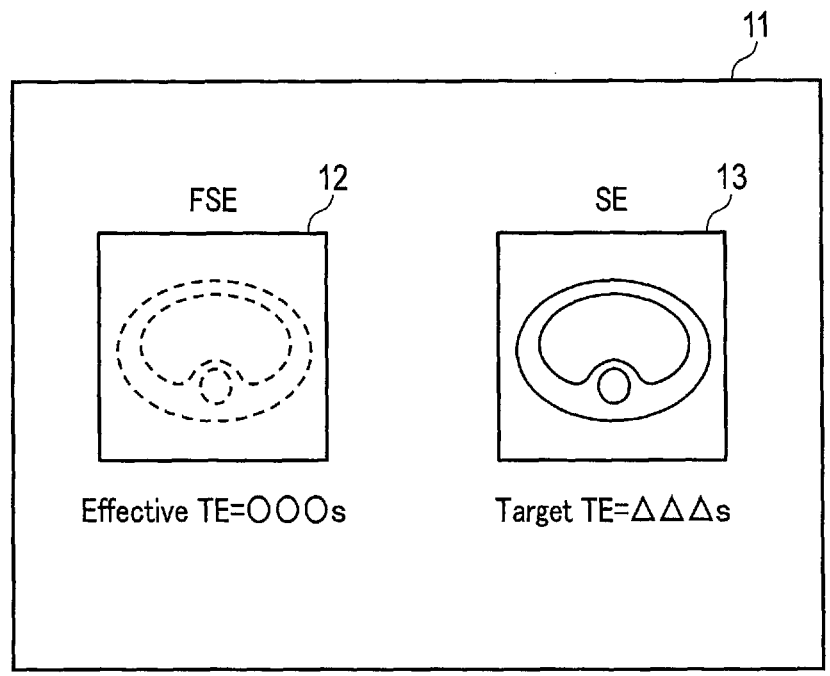
FIG. 8 is a diagram showing an example of a display screen of the SE image data.

FIG. 8 is a diagram showing an example of a display screen I1 of the SE image data. As shown in FIG. 8, FSE image data I2 and SE image data I3 are displayed side by side on the display screen I1. Preferably, the effective echo time and the target TE are displayed side by side on the FSE image data I2 and the SE image data I3, respectively. In a case where three-dimensional imaging is performed as the FSE method, the FSE image data and the SE image data will be three-dimensional image data. In this case, the processing circuitry 51 applies rendering processing to three-dimensional FSE image data to generate two-dimensional FSE image data, and displays this on the display 53. The processing circuitry 51 applies rendering processing to three-dimensional SE image data to generate two-dimensional SE image data, and displays this on the display 53.

As other aspects of output in step S6, the processing circuitry 51 may transfer the SE data to other computers that are connected to the magnetic resonance imaging apparatus 1 via the communication interface 55, or may store the SE data in the memory 52.

This concludes the MR examination according to the magnetic resonance imaging apparatus 1.

The flow of processing shown in FIG. 5 may be changed as appropriate. For example, the selecting process of the trained model (step S4) may be performed before the setting process of the imaging parameter (step S2) or the magnetic resonance imaging (step S3).

Furthermore, in step S2, the processing circuitry 51 may set the effective echo time automatically according to the target TE. For example, in a case where the target TE is a base TE*8, the base TE*8 may be set as the effective echo time of the FSE method.

As explained above, in the magnetic resonance imaging stage, the magnetic resonance imaging apparatus 1 performs high-speed imaging that allows data in which a plurality of imaging contrasts are mixed to be acquired as in the high-speed spin echo method, and, in the image generating stage, the magnetic resonance imaging apparatus 1 generates high image quality data relating to a single imaging contrast based on the mixed data. That is, the present operation example can benefit from both the high-speed imaging of the high-speed spin echo method and the high image quality of the conventional spin echo method.

The learning function 517 of the processing circuitry 51 will now be explained. The processing circuitry 51 generates a trained model, etc. by supervised machine learning that uses input data including a plurality of data segments corresponding respectively to a plurality of imaging contrasts and output data corresponding to a single imaging contrast as supervising data. For example, the processing circuitry 51 generates the trained model 60 by supervised machine learning that uses the FSE data including a plurality of data segments corresponding respectively to a plurality of echo times and correct SE data corresponding to the target TE as supervising data. The FSE data and the SE data to be used as the supervising data may be acquired by the magnetic resonance imaging apparatus 1, or may be acquired by other magnetic resonance imaging apparatuses. The processing target is the same for the combination of the input data and the output data belonging to the same supervising data. For example, a combination of the FSE data and the correct SE data relating to the same subject is used as the supervising data.

In the learning function 517, the processing circuitry 51 applies a machine learning model to the FSE data to perform forward propagation processing, and outputs estimated SE data. The processing circuitry 51 then applies the machine learning model to a difference (an error) between the estimated SE data and the correct SE data to perform reverse propagation processing, and calculates a gradient vector. The processing circuitry 51 then updates parameters of for example a weighted matrix and a bias of the machine learning model based on the gradient vector. By repeating the forward propagation processing and the reverse propagation processing relating to a plurality of supervising data, and updating the parameter, the trained model is completed.

The SE data may be acquired by a single echo method as shown in FIG. 3, or may be acquired by a multi-echo method. The single echo method is a method for acquiring one MR signal by applying one excitation pulse, then, subsequently applying one refocusing pulse. In the single echo method, the MR signal is acquired over multiple times at the same echo time while changing an encode. The multi-echo method is a method for acquiring a plurality of MR signals at different echo times at a same encode by applying one excitation pulse, then, subsequently applying refocusing pulses over multiple times. By using the multi-echo method, the SE data of different echo times can be acquired in a short time. The FSE data should be acquired by the FSE method as shown in FIG. 3.

The trained model may also be generated by utilizing methods of generative adversarial networks (GANs) or pix2pix, etc.

The present embodiment can be variously modified as long as it does not deviate from the point of view of benefiting from both the high-speed imaging and the high image quality. Various modified examples will be explained below.

Modified Example 1

Figure 9:
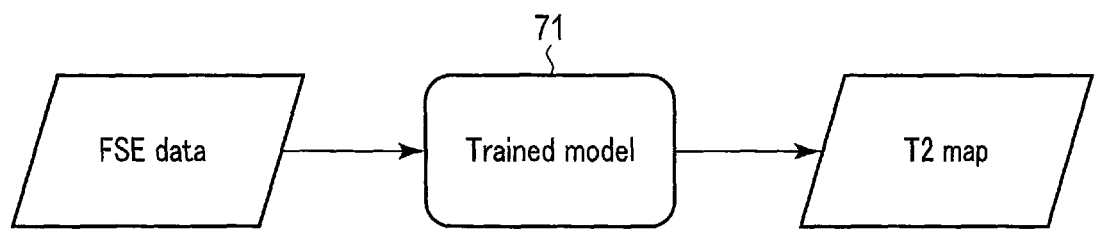
FIG. 9 is a diagram showing an input/output relationship of a trained model according to modified example 1.

FIG. 9 is a diagram showing an input/output relationship of a trained model 71 according to modified example 1. As shown in FIG. 9, the trained model 71 is a machine learning model that is trained to have the FSE data including a plurality of data segments corresponding respectively to a plurality of echo times as input data, and have a T2 map based on a plurality of data segments corresponding respectively to a plurality of echo times as output data. The T2 map is an image that shows spatial distribution of a T2 value.

In the stage of generating the trained model 71, the T2 map may be calculated by any means. For example, the processing circuitry 51 generates the T2 map based on a plurality of data segments corresponding respectively to a plurality of echo times, which are input data acquired by the high-speed spin echo method. The T2 value is calculated by a tilt in a signal value (or a pixel value) with respect to the echo time of the data segment (or the MR image). In order to calculate a correct T2 value, it is preferable to use a plurality of data segments corresponding respectively to a plurality of echo times. Since the T2 map, which is the output data of the trained model 71, is calculated based on data of a plurality of echo times of the FSE data, which is the input data, the FSE data which is the input data and the T2 map which is the output data may be considered to be correlated.

The trained model 71 is a machine learning model that is trained to have the FSE data including a plurality of data segments corresponding respectively to a plurality of echo times as input data, and have an R2 map as output data. The R2 map is an image that shows spatial distribution of an R2 value, which is a reciprocal of the T2 value. Similarly, in this case, since the R2 map, which is the output data of the trained model 71, is calculated based on data of a plurality of echo times of the FSE data, which is the input data, the FSE data which is the input data and the R2 map which is the output data may be considered as being correlated.

It should be noted that, generally, results would not match between a case of learning the T2 value by machine learning and obtaining the reciprocal thereof; and a case of learning the R2 value. T2 and R2 may be evaluated. Specifically, the T2 map and the R2 map may be generated based on a T2 loss function and an R2 loss function. The loss function may be any function, such as an L1 regularization function, an L2 regularization function, or a GAN loss function. For example, the function is defined by $|y-y'|^2$ and $|1/y-1/y'|^2$. Y is a calculated or measured T2 value, and y' is a vector or a matrix of the T2 value obtained by a machine learning model. If the vector or the element of the matrix is zero or a value close to zero, it may disturb the learning. Therefore, the reciprocals of these values may be replaced by a predetermined value of, for example, a minute positive numeric value e.

According to modified example 1, in the magnetic resonance imaging stage, high-speed imaging that allows data in which a plurality of imaging contrasts are mixed to be acquired as in the FSE method is performed, and, in the image generating stage, a T2 map or an R2 map of high image quality can be generated in a short time based on the mixed data.

Modified Example 2

FIG. 10 is a diagram showing an input/output relationship of a trained model 72 according to modified example 2. As shown in FIG. 10, the trained model 72 is a machine learning model that is trained to have first FSE data including a plurality of data segments corresponding respectively to a plurality of echo times and second FSE data including a plurality of data segments corresponding respectively to a plurality of echo times as input data, and have SE data corresponding to a single echo time (target TE) among the plurality of echo times as output data.

An effective echo time differs between the first FSE data and the second FSE data. The target TE of the SE data may be set to the effective echo time of the first FSE data or the second FSE data. For example, the effective echo time of the first FSE data is set to base TE*3, the effective echo time of the second FSE data is set to base TE*4, and the target TE of the SE data is set to the base TE*3. The target TE of the SE data may be set to an echo time that is different from the effective echo time of the first FSE data and the second FSE data. The SE data of the output data may be a T2 map or an R2 map as in modified example 1.

The second FSE data may be data acquired by a high-speed imaging method other than the high-speed spin echo method, such as a gradient echo (GRE) method or a field echo (FE) method. The GRE method or the FE method is means for acquiring MR signals (gradient echo signals) by one excitation pulse followed by an inversion of a gradient field polarity. Furthermore, the second FSE data may be data acquired by an evolution type GRE method or FE method of, for example, a gradient recalled acquisition in the steady state (GRASS), a fast imaging with steady state precession (FISP), a spoiled GRASS (SPGR), and a fast low-angle shot (FLASH).

Furthermore, input data is not limited to two sets of data acquired by performing high-speed imaging twice, and may be at least three sets of data acquired by performing high-speed imaging at least three times.

According to modified example 2, the SE data, the T2 map, or the R2 map relating to a single imaging contrast can be generated based on two or more pieces of data acquired by performing high-speed imaging at least twice. As a result, improvement in output data accuracy may be expected.

Modified Example 3

FIG. 11 is a diagram showing an input/output relationship of a trained model 73 according to modified example 3. As shown in FIG. 11, the trained model 73 is a machine learning model that is trained to have FSE data including a plurality of data segments corresponding respectively to a plurality of echo times as input data, and have first SE data corresponding to a single first echo time (target TE) among the plurality of echo times and second SE data corresponding to a single second echo time (target TE) among the plurality of echo times as output data.

The first SE data relating to the first target TE and the second SE data relating to the second target TE in an acquisition stage of supervising data may be acquired separately by a single echo method, or may be acquired in parallel by a multi-echo method. By using the multi-echo method, the first SE data and the second SE data can be acquired in a short time.

The first SE data or the second SE data may be a T2 map or an R2 map. The first SE data and the second SE data may be the T2 map and the R2 map. As in modified example 2, the input data may be two or more data acquired by performing high-speed imaging at least twice. Furthermore, output data is not limited to two sets of data, and may be at least three sets of data.

Modified Example 4

FIG. 12 is a diagram showing an input/output relationship of a trained model 74 according to modified example 4. As shown in FIG. 12, the trained model 74 outputs, from FSE data including a plurality of data segments corresponding respectively to a plurality of echo times, SE data corresponding to an echo time interpolated from the plurality of echo times. The echo time interpolated from the plurality of echo times is an echo time included in a time range (hereinafter, referred to as an echo time range) defined by the plurality of echo times, and may match one or none of the plurality of echo times. The echo time range is defined as a time range from the shortest echo time to the longest echo time among a plurality of echo times relating to the FSE data.

For example, the echo time relating to the FSE data is 20 ms, 40 ms, 60 ms, 120 ms, and 240 ms. The echo time relating to the SE data does not match any of a plurality of echo times of the FSE data, but is included in the echo time range relating to the FSE data. In the case of FIG. 12, the echo time range relating to the FSE data is defined as a range from 20 ms, which is the shortest echo time, to 240 ms, which is the longest echo time. In the case of FIG. 12, the echo time of the SE data is included in an echo time range relating to the FSE data (a range from 20 ms to 240 ms), but is set to 80 ms, which does not match 20 ms, 40 ms, 60 ms, 120 ms, and 240 ms. The echo time of the SE data according to modified example 4 is not limited to 80 ms, and may be set to any time included in the range from 20 ms to 240 ms.

The learned model 74 is generated by a learning function 517 of processing circuitry 51. For example, the trained model 74 is trained based on input data including the FSE data including a plurality of data segments corresponding respectively to a plurality of echo times, and output data including the SE data corresponding to an echo time interpolated to the plurality of echo times. A combination of a plurality of echo times relating to the input FSE data is set, for example, to be identical with respect to a plurality of learning samples. For example, the echo time is fixed at 20 ms, 40 ms, 60 ms, 120 ms, and 240 ms with respect to a plurality of learning samples. The combination of a plurality of echo times may also be set to differ with respect to a plurality of learning samples. For example, the combination of the echo times in the first learning sample is 20 ms, 40 ms, 60 ms, 120 ms, and 240 ms; however, the combination of the echo times in the second learning sample may be 30 ms, 60 ms, 90 ms, 150 ms, and 270 ms. The echo time of the output SE data of each learning sample may match one or none of a plurality of echo times of the input FSE data.

According to modified example 4, since the echo time of the SE data is not limited to the echo time of the FSE data, the range of choices of echo time of the SE data is expanded. Furthermore, since it is unnecessary to prepare the FSE data relating to all of the assumed echo times, the trouble of acquiring the learning samples may be reduced.

Modified Example 5

FIG. 13 is a diagram showing an input/output relationship of a trained model 75 according to modified example 5. As shown in FIG. 13, the trained model 75 outputs, from FSE data including a plurality of data segments corresponding respectively to a plurality of echo times, a plurality of SE data corresponding respectively to a plurality of echo times.

For example, the echo time relating to the FSE data is 20 ms, 40 ms, 60 ms, 120 ms, and 240 ms. The echo time relating to the SE data is at least one echo time interpolated from a plurality of echo times relating to the FSE data. The echo time relating to the SE data may or may not match the echo time relating to the FSE data. For example, in the case of FIG. 13, three types of SE data, which are SE data in which an echo time that does not match the echo time relating to the FSE data is 50 ms, SE data in which an echo time that matches the echo time relating to the FSE data is 60 ms, and SE data in which an echo time that does not match the echo time relating to the FSE data is 70 ms, are output. The number of types of SE data to be output by the trained model 75 is not limited to three types, and may be any number as long as it is two or more types.

The trained model 75 is generated by a learning function 517 of processing circuitry 51. For example, the trained model 75 is trained based on input data including the FSE data including a plurality of data segments corresponding respectively to a plurality of echo times, and output data including a plurality of pieces of SE data corresponding respectively to two or more echo times included in a time range interpolated from the plurality of echo times. A combination of a plurality of echo times relating to the input FSE data is set, for example, to be identical with respect to a plurality of learning samples. For example, the echo time is fixed at 20 ms, 40 ms, 60 ms, 120 ms, and 240 ms with respect to a plurality of learning samples. The combination of a plurality of echo times may also be set to differ with respect to a plurality of learning samples. For example, the combination of an echo time in a first learning sample is 20 ms, 40 ms, 60 ms, 120 ms, and 240 ms; however, the combination of an echo time in a second learning sample may be 30 ms, 60 ms, 90 ms, 150 ms, and 270 ms. The combination of a plurality of echo times relating to the output SE data is set to be identical respect to a plurality of learning samples. The combination of a plurality of echo times relating to the output SE data may match one or none of a plurality of echo times of the input FSE data.

Modified Example 6

In the above embodiment, the high-speed spin echo method is explained as being the fast spin echo method. The high-speed spin echo method according to modified example 6 is assumed to be a gradient and spin echo (GRASE) method.

FIG. 14 is a diagram showing pulse sequences of a conventional spin echo method and the GRASE method. The GRASE method has a pulse sequence in which an FSE method and an EPI method are combined. The GRASE method is also referred to as a hybrid EPI method.

As shown in FIG. 14, the GRASE method has a pulse sequence that acquires a plurality of MR signal trains by applying one 90° excitation pulse, followed by a plurality of 180° refocusing pulses, and is a type of high-speed spin echo method. Although not shown, the EPI method is performed between two neighboring refocusing pulses. More specifically, between the two neighboring refocusing pulses, a plurality of frequency encode gradient fields (readout gradient fields) and a phase encode gradient field are applied while alternately changing the positive and negative polarities. As a result, an MR signal train for a phase encode corresponding to the applied phase encode gradient field is generated.

The echo time of the GRASE method is defined as a time from applying the 90° excitation pulse to generating the MR signal upon refocusing timing among the MR signal trains. An echo time relating to the nth MRI signal train from the application of the 90° excitation pulse will be expressed as base TE*n. As time passes from the application of the 90° excitation pulse, the intensity of the MR signal attenuates by T2 relaxation (transverse relaxation). The intensity of the MR signal before and after the refocusing attenuates by T2* relaxation (apparent transverse relaxation). Among each MR signal train, signal attenuation of the intensity of the MR signal corresponding to the echo time, that is, the MR signal upon refocusing caused by the T2* relaxation is substantially zero, and signal attenuation caused by T2 relaxation is dominant. Signal attenuation caused by the T2* relaxation substantially occurs to intensities of other MR signals among each MR signal train. Therefore, the intensities of the other MR signals include signal attenuations of both the T2* relaxation and the T2 relaxation.

In the GRASE method according to the present embodiment, each phase encode amount is set so that a k-space of one frame is filled by a plurality of data segments corresponding respectively to a plurality of MR signal trains. For example, in a case where the k-space of one frame is filled by a plurality of data segments corresponding respectively to three MR signal trains, k-space data that includes three data segments corresponding respectively to three echo times is acquired.

In the excitation pulse shown in FIG. 14, an angle at which magnetization is tilted is 90°; however, the angle is not limited thereto, and may be any angle. In the refocusing pulse shown in FIG. 14, an angle at which magnetization is tilted is 180°; however, the angle is not limited thereto, and may be any angle that is 90° or larger. Furthermore, the excitation pulse, the refocusing pulse, and the MR signal shown in FIG. 14 have a pulse shape. However, since FIG. 14 is a schematic diagram, the actual shape may be any shape, such as a sinc shape or a rectangular shape. Furthermore, each MR signal train includes three MR signals; however, this is an exemplification. Therefore, any number of MR signals may be included in the MRI signal train.

FIG. 15 is a diagram showing an input/output relationship of a trained model 76 according to modified example 6. Hereinafter, the k-space data, the hybrid data, or the MR image data acquired by the GRASE method will collectively be referred to as GRASE data. As shown in FIG. 15, the trained model 76 outputs, from the GRASE data including a plurality of data segments corresponding respectively to a plurality of echo times, SE data corresponding to an echo time interpolated from a plurality of echo times relating to the GRASE data.

For example, the echo time relating to the GRASE data is set to 20 ms, 120 ms, and 240 ms. The echo time relating to the SE data matches none of a plurality of echo times relating to the GRASE data, but is included in an echo time range relating to the GRASE data. In the case of FIG. 12, the echo time range relating to the GRASE data is defined as a range from 20 ms, which is the shortest echo time, to 240 ms, which is the longest echo time. In the case of FIG. 15, the echo time of the SE data is set to, for example, 120 ms, which is included in the echo time range relating to the GRASE data (a range from 20 ms to 240 ms). The echo time relating to the SE data is not limited to 120 ms, which matches the echo time relating to the GRASE data. As long as the echo time relating to the SE data is included in the echo time range relating to the GRASE data, it may be set to an echo time that does not match the echo time relating to the GRASE data.

The trained model 76 is generated by a learning function 517 of processing circuitry 51. For example, the trained model 76 is trained based on input data including the GRASE data including a plurality of data segments corresponding respectively to a plurality of echo times, and output data including the SE data corresponding to an echo time interpolated from a plurality of echo times relating to the GRASE data. A combination of a plurality of echo times relating to the input GRASE data is set, for example, to be identical with respect to a plurality of learning samples. For example, the echo time is fixed at 20 ms, 120 ms, and 240 ms with respect to a plurality of learning samples.

A plurality of echo times relating to the input GRASE data may also be set to differ with respect to a plurality of learning samples. For example, a combination of echo times in a first learning sample is 20 ms, 120 ms, and 240 ms; however, a combination of echo times in a second learning sample may be 30 ms, 150 ms, and 270 ms.

For output data (correct data) of each learning sample, SE data acquired by the conventional spin echo method is used separately from the input GRASE data. The echo time of the correct SE data should be selected as any echo time interpolated from a plurality of echo times relating to the input GRASE data.

According to modified example 6, SE data in which a plurality of imaging contrasts are not mixed can be generated based on the GRASE data in which a plurality of imaging contrasts are mixed. In this manner, the present embodiment can benefit from both the high-speed imaging of the GRASE method and the high image quality of the conventional spin echo method.

In the above example, the k-space filling method of the EPI method included in the GRASE method is not limited in particular. The k-space filling method may be a zigzag method, a spiral method, a cone method, or any other method. Furthermore, as an example of the high-speed spin echo method, the GRASE method combining the FSE method and EPI is given. However, it is not limited thereto. For example, instead of the EPI method, any imaging method, such as a controlled aliasing in parallel imaging results in higher acceleration (wave CAIPI), may be performed between two neighboring refocusing pulses.

Other Examples

In the various embodiments described above, data segments are described as being dividable so that data corresponding to one imaging contrast is included only in the corresponding data segment, and is not included in the other data segments. However, the present embodiment is not limited thereto. Data segments may be divided in a manner such that the data of one imaging contrast is present over at least two data segments.

General Description

According to the various embodiments described above, the data processing apparatus according to the present embodiment comprises the processing circuitry 51. The processing circuitry 51 acquires input data relating to the processing target. The input data relating to the processing target includes a plurality of data segments corresponding respectively to a plurality of imaging contrasts determined by a first pulse sequence. The processing circuitry 51 applies a trained model to the input data relating to the processing target, and generates output data relating to the processing target. A trained model is a machine learning model that is trained based on training data including the input data and the output data. The input data includes a plurality of data segments corresponding respectively to a plurality of imaging contrasts determined by the first pulse sequence. The output data includes one or more imaging contrasts determined by a second pulse sequence. The processing circuitry 51 outputs the output data relating to the processing target.

The one or more imaging contrasts determined by the second pulse sequence is interpolated from a plurality of imaging contrasts determined by the first pulse sequence. In other words, the one or more imaging contrasts determined by the second pulse sequence are imaging contrasts that do not exceed a range between a lower limit and an upper limit of a plurality of imaging contrasts determined by the first pulse sequence. The imaging contrast determined by the second pulse sequence means an imaging contrast determined by various imaging parameters of the second pulse sequence. The one or more imaging contrasts determined by the second pulse sequence may be a single imaging contrast as shown in FIG. 4, FIG. 9, FIG. 10, and FIG. 12, etc., or may be a plurality of imaging contrasts as shown in FIG. 11 and FIG. 13, etc. The first pulse sequence is a pulse sequence for acquiring a plurality of MR signals by applying one excitation pulse and, subsequently, a plurality of refocusing pulses. The second pulse sequence is a pulse sequence for acquiring one MR signal by applying one excitation pulse and, subsequently, one refocusing pulse.

The first pulse sequence is a high-speed spin echo method, and the second pulse sequence is a conventional spin echo method. For example, the first pulse sequence may be the FSE method shown in FIG. 4, etc., or the GRASE method shown in FIG. 15, etc. The imaging contrast is determined by an echo time.

According to another respect, the data processing apparatus according to the present embodiment comprises processing circuitry 51. The processing circuitry 51 acquires input data relating to a processing target that was acquired by the first pulse sequence. The first pulse sequence is a pulse sequence for acquiring a plurality of MR signals at different refocusing time points by applying one excitation pulse and, subsequently, a plurality of refocusing pulses. The processing circuitry 51 applies a trained model to input data relating to the processing target, and generates output data relating to the processing target. The trained model is a model that is trained based on the input data acquired by the first pulse sequence and the output data acquired by the second pulse sequence. The second pulse sequence is a pulse sequence for acquiring a single MR signal at a single refocusing time point by applying one excitation pulse and, subsequently, one refocusing pulse. The processing circuitry 51 outputs the output data relating to the processing target.

As mentioned above, the intensity of the MR signal attenuates by T2 relaxation from the time point of applying the excitation pulse. Since each spin is subject to phase dispersion caused by fluctuations in the static magnetic field, etc., intensity of the MR signal attenuates also by T2* relaxation. The T2* relaxation becomes zero at a time point when each spin is re-converged by the application of the refocusing pulse. That is, since there is substantially zero influence of the T2* relaxation on the MR signal generated at the refocusing time point, it becomes possible to perform T2 measurement based on the MR signal generated at the refocusing time point without the influence of the T2* relaxation. The MR signal generated at the refocusing time point is also referred to as a T2w signal. The refocusing time point corresponds to an imaging contrast or, more specifically, an echo time.

The first pulse sequence can acquire a plurality of T2w signals, in contrast to the second pulse sequence. However, the image quality of the obtained data is comparatively low. On the other hand, the second pulse sequence cannot acquire a single T2w signal, in contrast to the first pulse sequence. However, the image quality of the obtained data is comparatively high. In the case where the first pulse sequence is a GRASE method, as shown in FIG. 14, the MR signal generated at a time point where frequency encode is zero among the MR signal trains corresponds to the T2w signal.

According to the above configuration, since the processing circuitry 51 is able to output the output data acquired by the second pulse sequence from the input data acquired by the first pulse sequence, T2-weighted data with a high image quality can be obtained at high speed. For example, in the case where the first pulse sequence is the GRASE method, although a T2w signal component and a non-T2w signal component are mixed in the input data, it is possible to obtain output data that includes only the T2w signal component. In the case where the first pulse sequence is the FSE method, although T2w signal components of different refocusing time points are mixed in the input data, it is possible to obtain output data that includes only the T2w signal component of a given refocusing time point.

According to at least one of the above-described embodiments, it is possible to obtain data with a high image quality from data acquired at a short imaging time.

The term "processor" used in the above explanation indicates, for example, a circuit, such as a CPU, a GPU, or an application specific integrated circuit (ASIC), and a programmable logic device (for example, a simple programmable logic device (SPLD), a complex programmable logic device (CPLD), and a field programmable gate array (FPGA)). The processor reads and executes programs stored in memory circuitry to execute respective functions thereof. Instead of storing the programs in the memory circuitry, the programs may be incorporated directly into circuitry of the processor. In this case, the processor reads and executes the programs incorporated in the circuitry to realize the respective functions. Furthermore, instead of executing the programs, functions corresponding to the programs may also be realized by a combination of logic circuits. Each processor of the present embodiment is not limited to a case of being configured as a single circuit. Therefore, one processor may be configured by a combination of a plurality of independent circuits, and may realize the functions thereof. Furthermore, a plurality of constituent elements shown in FIG. 1 may be integrated into a processor to realize the function thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A data processing apparatus comprising processing circuitry, wherein
the processing circuitry is configured to:
acquire input data relating to a processing target including a plurality of data segments corresponding respectively to a plurality of imaging contrasts determined by a first pulse sequence;
generate output data relating to the processing target by applying a trained model to the input data relating to the processing target, the trained model being trained based on input data including a plurality of data segments corresponding respectively to a plurality of imaging contrasts determined by the first pulse sequence and output data including one or more imaging contrasts determined by a second pulse sequence; and
output the output data relating to the processing target.

2. The data processing apparatus according to claim 1, wherein the one or more imaging contrasts determined by the second pulse sequence is interpolated from the plurality of imaging contrasts determined by the first pulse sequence.

3. The data processing apparatus according to claim 1, wherein
the first pulse sequence is a pulse sequence for acquiring a plurality of MR signals by applying one excitation pulse and, subsequently, a plurality of refocusing pulses, and
the second pulse sequence is a pulse sequence for acquiring one MR signal by applying one excitation pulse and, subsequently, one refocusing pulse.

4. The data processing apparatus according to claim 3, wherein
the first pulse sequence is a high-speed spin echo method,
the second pulse sequence is a conventional spin echo method, and
the imaging contrast is determined by an echo time.

5. The data processing apparatus according to claim 4, wherein
the input data includes a plurality of data segments corresponding respectively to a plurality of echo times which are acquired by the high-speed spin echo method, and
the output data used to generate the trained model includes one or more data sets corresponding respectively to one or more echo times determined by the conventional spin echo method, each of the one or more data sets being a data set corresponding to a single echo time.

6. The data processing apparatus according to claim 5, wherein the single echo time is set to an echo time corresponding to a data segment positioned at a center of a k-space among the plurality of echo times.

7. The data processing apparatus according to claim 5, wherein the single echo time is set to an echo time corresponding to a data segment positioned in a k-space region other than the center of a k-space among the plurality of echo times.

8. The data processing apparatus according to claim 5, wherein the output data used to generate the trained model is acquired by a multi-echo method which, subsequent to applying one excitation pulse, acquires two or more MR signals at the same encode and at different echo times.

9. The data processing apparatus according to claim 1, wherein
the trained model comprises a plurality of first neural network layers that process each of the plurality of data segments, a combined layer that combines a plurality of outputs from the plurality of first neural network layers, and a second neural network layer that processes an output from the combined layer, and
the processing circuitry is configured to generate the output data relating to the processing target by applying the plurality of first neural network layers, the combined layer, and the second neural network layer to the input data relating to the processing target.

10. The data processing apparatus according to claim 9, wherein
the processing circuitry is configured to:
divide k-space data relating to the processing target into the plurality of data segments; and
input the plurality of data segments respectively to the plurality of first neural network layers as the input data.

11. The data processing apparatus according to claim 1, wherein
the processing circuitry is configured to:
divide k-space data relating to the processing target into the plurality of data segments;
generate a plurality of MR images based on the plurality of data segments; and
input the plurality of MR images to the trained model as the input data.

12. The data processing apparatus according to claim 1, wherein the output data used for generating the trained model is a T2 map that shows spatial distribution of a T2 value, or an R2 map that shows spatial distribution of a reciprocal of the T2 value, which are generated based on the plurality of data segments acquired by the high-speed spin echo method.

13. The data processing apparatus according to claim 1, wherein the input data includes a first data set relating to a first effective echo time and a second data set relating to a second effective echo time, which are acquired by a high-speed spin echo method.

14. The data processing apparatus according to claim 1, wherein the input data includes a first data set acquired by a high-speed spin echo method and a second data set acquired by other pulse sequence methods.

15. The data processing apparatus according to claim 1, wherein the output data is two or more data sets corresponding respectively to two or more imaging contrasts among the plurality of imaging contrasts.

16. The data processing apparatus according to claim 1, further comprising a storage apparatus that stores two or more trained models corresponding respectively to two or more imaging contrasts among the plurality of imaging contrasts, wherein
the processing circuitry is configured to:
set an imaging contrast of an imaging target among the two or more imaging contrasts; and
select a trained model corresponding to the imaging contrast of the imaging target from among the two or more trained models, and generate the output data relating to the processing target by applying the selected trained model to the input data relating to the processing target.

17. The data processing apparatus according to claim 1, wherein the processing circuitry is configured to acquire the input data relating to the processing target by executing magnetic resonance imaging with respect to the processing target.

18. A data processing apparatus comprising processing circuitry, wherein
the processing circuitry is configured to:
acquire input data relating to a processing target acquired by a first pulse sequence, wherein the first pulse sequence is a pulse sequence for acquiring a plurality of MR signals at different refocusing time points by applying one excitation pulse and, subsequently, a plurality of refocusing pulses;
generate output data relating to the processing target by applying a trained model to input data relating to the processing target, wherein the trained model is a model that is trained based on input data acquired by the first pulse sequence and output data acquired by a second pulse sequence, and the second pulse sequence is a pulse sequence for acquiring a single MR signal at a single refocusing time point by applying one excitation pulse and, subsequently, one refocusing pulse; and
output output data relating to the processing target.

19. A data processing method comprising:
acquiring input data relating to a processing target including a plurality of data segments corresponding respectively to a plurality of imaging contrasts determined by a first pulse sequence;
generating output data relating to the processing target by applying a trained Model to the input data relating to the processing target, the trained model being trained based on input data including a plurality of data segments corresponding respectively to a plurality of imaging contrasts determined by the first pulse sequence and output data corresponding to one or more imaging contrasts determined by a second pulse sequence; and
outputting output data relating to the processing target.

* * * * *